(12) United States Patent
Chen et al.

(10) Patent No.: US 8,004,097 B2
(45) Date of Patent: Aug. 23, 2011

(54) CARRIER WAFER HAVING ALIGNMENT KEYS AND SUPPORTING A CHIP

(75) Inventors: Howard Hao Chen, Yorktown Heights, NY (US); Louis L. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 322 days.

(21) Appl. No.: 12/244,503

(22) Filed: Oct. 2, 2008

(65) Prior Publication Data
US 2009/0020891 A1    Jan. 22, 2009

Related U.S. Application Data

(63) Continuation of application No. 10/994,574, filed on Nov. 22, 2004, now Pat. No. 7,442,579.

(51) Int. Cl.
*H01L 23/544* (2006.01)

(52) U.S. Cl. .............................. 257/797; 257/E23.179

(58) Field of Classification Search ............... 257/778, 257/E21.526, E21.122, E1.5, E23.179, 797; 438/598
See application file for complete search history.

(56) References Cited

U.S. PATENT DOCUMENTS

| | | | | |
|---|---|---|---|---|
| 5,704,116 | A * | 1/1998 | Gamota et al. | 29/840 |
| 6,057,206 | A * | 5/2000 | Nguyen et al. | 438/401 |
| 6,140,707 | A * | 10/2000 | Plepys et al. | 257/778 |
| 2002/0014703 | A1* | 2/2002 | Capote et al. | 257/778 |

\* cited by examiner

*Primary Examiner* — Khiem D Nguyen
(74) *Attorney, Agent, or Firm* — F. Chau & Associates, LLC; Brian P. Verminski, Esq.

(57) ABSTRACT

Methods for manufacturing an integrated wafer scale package that reduces a potential misalignment between a chip and a pocket of a carrier substrate. According to one aspect of the present invention, a method for manufacturing a semiconductor device includes a photoresist layer disposed on a carrier substrate, a chip placed onto a surface of the photoresist layer. The photoresist layer is patterned using the chip as a mask. The chip is removed from the photoresist layer after the patterning step. A pocket is formed in the carrier substrate, and the chip that was removed is placed into the pocket formed in the carrier substrate.

7 Claims, 11 Drawing Sheets

CARRIER WAFER HAVING ALIGNMENT KEYS AND SUPPORTING A CHIP

CROSS-REFERENCE TO RELATED APPLICATIONS

This is a Continuation Application claiming the benefit of U.S. application Ser. No. 10/994,574, now U.S. Pat. No. 7,442,579, filed on Nov. 22, 2004, the entire contents of which are herein incorporated by reference.

TECHNICAL FIELD OF THE INVENTION

The present invention relates, generally, to semiconductor device manufacturing and more specifically to techniques in manufacturing semiconductor devices that utilize integrated wafer scale packaging.

BACKGROUND

An integrated wafer scale package using partial wafer bonding and partial wafer dicing techniques has been proposed to integrate a processor and memory chips that are fabricated on different wafers. By using lithography patterning and reactive ion etching, the formation of trenches can be precisely controlled within a tolerance of 100 nanometers to cut out chips from a dummy wafer. An example of this procedure is disclosed in U.S. Pat. No. 6,277,666 to Hays, et al., entitled: "Precisely defined microelectromechanical structures and associated fabrication methods."

However, the transferring of a chip from a dummy wafer to a target carrier wafer remains a challenge due to uncertainties in the exact size of the chip, the exact size of a pocket on the carrier wafer, and an alignment of the chip within its respective pocket on the carrier wafer.

To accommodate for a potential misalignment during a manufacturing process, a size of the pocket on the carrier wafer should be greater than a size of the chip by at least twice a predetermined process tolerance between the chip and the pocket within the carrier wafer. For example, FIG. 1 illustrates a chip within a pocket fabricated according to a conventional manufacturing process. As shown in FIG. 1, a chip 16 is disposed within a pocket 14. The gap 12 formed between the chip 16 and the pocket 14 is at least twice the size as a process tolerance 18, or "k". The process tolerance 18 can reach 1 to 2 microns in standard silicon technology. The process tolerance 18 takes into account not only the chip and pocket dimension variations due to mask generation, lithography, substrate etching and dicing, but also accounts for other process variations such as wafer-to-wafer and lot-to-lot variations. Furthermore, to allow the chip to be placed into its corresponding pocket, a small gap is reserved between the sidewalls of the chip and the pocket to accommodate any rough edges and minor debris. Depending on the dicing technique, it is estimated that the total potential misalignment, including process tolerance and reserved gaps on both sides of the chip, can reach 5 microns.

The potential misalignment between the chip and the pocket has an adverse effect on an I/O density of the chip and a first-level global wiring pitch of an integrated wafer scale package. For example, FIG. 2 illustrates adverse effects on an I/O density of a chip and the first-level global wiring pitch of an integrated wafer scale package. As illustrated in FIG. 2, if the misalignment is "s", the size of the I/O pad 21 is "d", and the width of global interconnect 23 is also "d", a landing pad 25 with the size of "d+2s" will be needed to ensure that a proper connection can be made between the I/O pad 21 and the global interconnect 23. Alternatively, the width of the global interconnect 23+ can be increased from "d" to "d+s" to accommodate the potential misalignment and ensure a proper connection between the I/O pad 21' and the global interconnect 23'. As a result, a minimal pitch of the first-level global interconnect 23' needs to be increased by "s".

Therefore, there is a need for a method of manufacturing an integrated wafer scale package that reduces a potential misalignment between a chip and a pocket of a carrier wafer.

SUMMARY OF THE INVENTION

Exemplary embodiments of the present invention include methods for forming an integrated wafer-scale package that improves an alignment tolerance between a chip and its respective pocket.

An exemplary embodiment relates to a method for fabricating a semiconductor device. The method includes depositing a photoresist layer on a carrier substrate, placing a chip onto a surface of the photoresist layer, patterning the photoresist layer using the chip as a mask, removing the chip from the photoresist layer, forming a pocket in the carrier substrate, and placing the chip into the pocket formed in the carrier substrate. The chip may be a Memory chip, a Logic chip, a MEMs device, an RF circuit or a passive device.

The step of placing the chip onto a surface of the photoresist layer may also include aligning the chip with a predetermined portion of the carrier substrate where the pocket is to be formed in the carrier substrate.

The step of forming a pocket in the carrier substrate may also include removing the unexposed portion of the photoresist layer, baking the exposed portions of the photoresist layer, and etching the carrier substrate using the exposed portions of the photoresist layer as a mask such that the pocket is formed in the carrier substrate. Preferably, the etching of the carrier substrate is performed using a reactive ion etching (RIE) technique. More preferably, the pocket is formed having a depth substantially equal to the thickness of the chip.

The step of placing the chip into the pocket formed in the carrier substrate may also include placing the chip into the pocket of the carrier substrate such that a surface of the chip is substantially co-planar with a surface of the carrier substrate.

The method may also include aligning the chip at a predetermined location on the carrier substrate. Alternatively, the method may include substantially aligning a first set of alignment keys of the chip with a second set of alignment keys of the carrier substrate. Preferably, the first set of alignment keys and the second set of alignment keys are disposed on either corners or sides of the chip and the carrier substrate, respectively.

Another exemplary embodiment relates to a method of manufacturing a semiconductor device. The method includes attaching a wafer to STI regions in a carrier substrate such that a void is formed between the STI regions and between the wafer and the carrier substrate, coating the wafer with a photoresist layer, placing a chip on the photoresist layer in an area above the void, patterning the photoresist layer using the chip as a mask, removing the chip, forming a pocket in the wafer above the carrier substrate, and placing the chip into the pocket. Preferably, the chip is placed into the pocket such that a surface of the chip is substantially co-planar with a surface of the wafer. The wafer is made of a semiconductor material. Preferably, the wafer comprises silicon, silicon germanium (SiGe), or gallium arsenide (GaAs).

The step of forming a pocket in the wafer above the carrier substrate may also include developing and removing a portion of the photoresist layer beneath the chip such that a portion of the wafer is exposed, cutting through predetermined portions of the exposed wafer to the void, and removing the exposed portion of the wafer such that a pocket is formed at a surface of the carrier substrate. Preferably, the pocket is formed having a depth substantially equal to the thickness of the chip.

The method may also include aligning the chip with a predetermined portion of the carrier substrate. Alternatively, the method may include substantially aligning a first set of alignment keys of the chip with a second set of alignment keys of the wafer.

Still another exemplary embodiment relates to a method for fabricating a semiconductor device. The method includes depositing a photoresist layer on a carrier substrate, aligning each of a plurality of chips with a predetermined location on the carrier substrate, placing the plurality of chips onto a surface of the photoresist layer, and patterning the photoresist layer using the plurality of chips as a mask.

The method may also include removing the plurality of chips from the photoresist layer, forming a plurality of pockets in the carrier substrate, wherein each of the plurality of chips corresponds to one of the plurality of pockets, and placing the chips into their corresponding pocket formed in the carrier substrate. Preferably, the plurality of chips is placed into its corresponding pocket of the carrier substrate such that a surface of each of the plurality of chips is substantially co-planar with a surface of the carrier substrate.

The method may also include using a computer-guided precision alignment table to align the plurality chips with the predetermined locations on the carrier substrate.

The method may also include substantially aligning a first set of alignment keys of the chip with a second set of alignment keys of the carrier substrate. Preferably, the first set of alignment keys and the second set of alignment keys are disposed on corners or sides of the chip and the carrier substrate, respectively.

Still yet another exemplary embodiment relates to a program storage device readable by machine, tangibly embodying a program of instructions executable by the machine to perform a method for fabricating a semiconductor device, the method steps including depositing a photoresist layer on a carrier substrate, aligning each of a plurality of chips with a predetermined location on the carrier substrate, placing the plurality of chips onto a surface of the photoresist layer, and patterning the photoresist layer using the plurality of chips as a mask.

The program storage device may also include the following method steps of removing the plurality of chips from the photoresist layer, forming a plurality of pockets in the carrier substrate, wherein each of the plurality of chips corresponds to one of the plurality of pockets, and placing the chips into their corresponding pocket formed in the carrier substrate.

These and other exemplary embodiments, features, aspects, and advantages of the present invention will be described and become more apparent from the detailed description of exemplary embodiments when read in conjunction with accompanying drawings.

DETAILED DESCRIPTION OF EXEMPLARY EMBODIMENTS

The present invention will now be described more fully herein after with reference to the accompanying drawings, in which exemplary embodiments of the invention are shown. This invention may, however, be embodied in different form and should not be construed as limited to the exemplary embodiments set forth herein. Rather, these exemplary embodiments are provided so that this disclosure will be thorough and complete, and will fully convey the spirit and scope of the invention to those skilled in the art.

According to exemplary embodiments of the present invention, methods to improve the alignment tolerance between a chip and its respective pocket of an integrated wafer-scale package are proposed. More specifically, patterning techniques using a corresponding chip as a mask and exposing a photoresist to define a pocket area of a carrier wafer are proposed.

Figure 3:
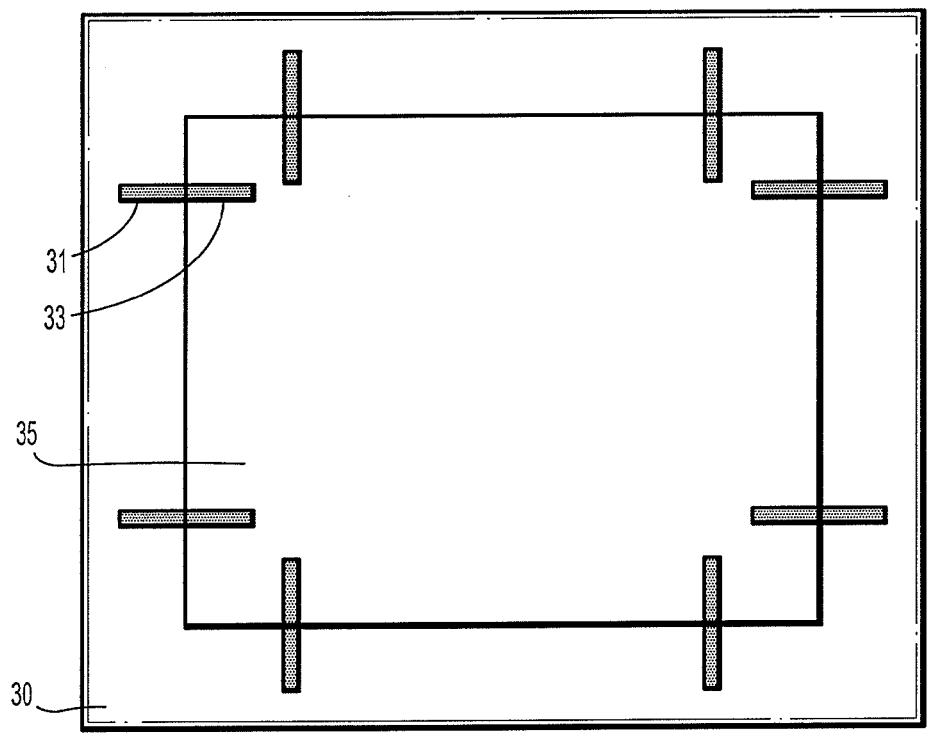
FIG. 3 illustrates a four-corner alignment scheme, according to an exemplary embodiment of the present invention.
Figure 4:
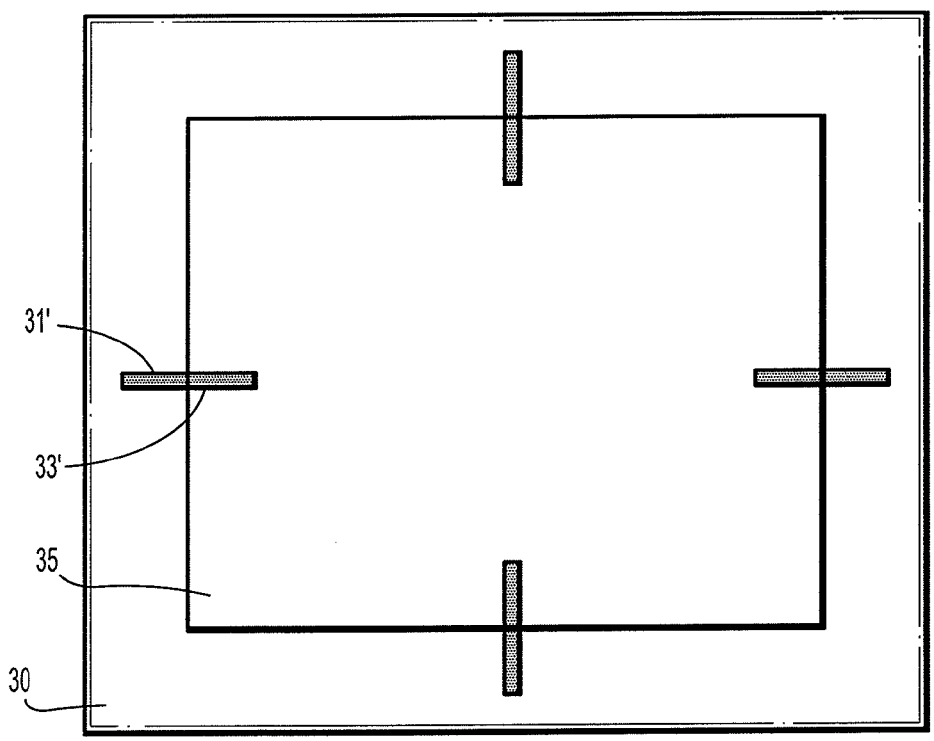
FIG. 4 illustrates a four sided alignment scheme, according to another exemplary embodiment of the present invention.

FIG. 3 illustrates a four-cornered alignment scheme, according to an exemplary embodiment of the present invention. Referring to FIG. 3, alignment keys 31 and 33 are prefabricated on a substrate 30 having a photoresist layer (not shown) disposed thereon and on a chip 35, respectively. After all the alignment keys 31 and 33 in the four corners of the substrate 30 and the chip 35 are aligned, the chip 35 is placed on the substrate 30 and temporarily held in place by the photoresist layer. Alternatively, FIG. 4 illustrates a four-sided alignment scheme, according to another exemplary embodiment of the present invention. Referring to FIG. 4, alignment keys 31' and 33' are prefabricated on the substrate 30 having a photoresist layer disposed thereon and the chip 35, respectfully. The alignment keys 31' and 33' are disposed on the four sides of the substrate 30 and the chip 35, respectively.

Figure 5A:
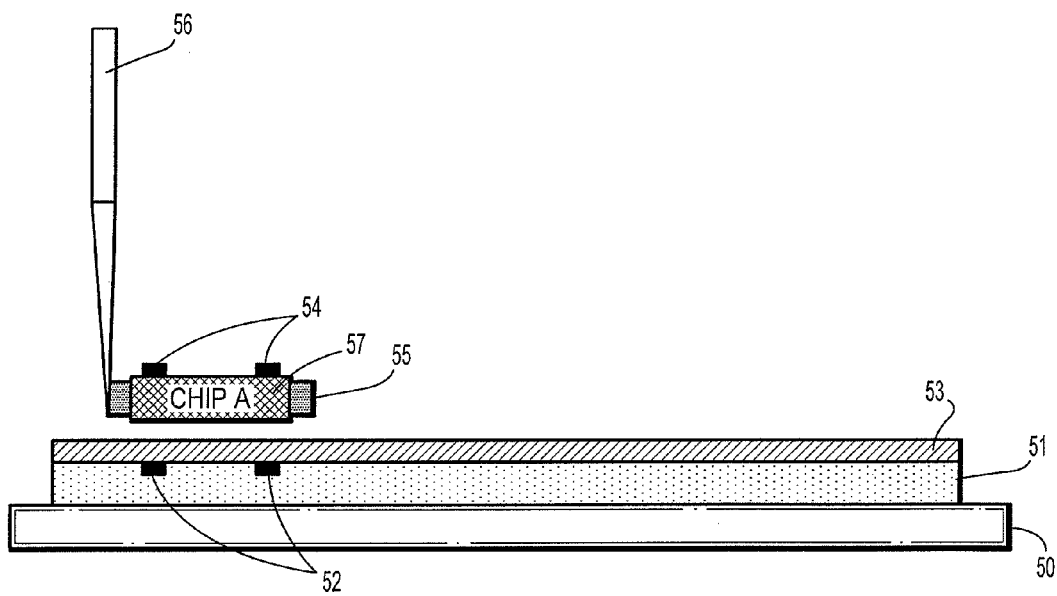
FIG. 5A shows a chip placed on a wafer mounted on an x-y guide table, according to an exemplary embodiment of the present invention.

FIG. 5A shows a chip placed on a wafer mounted on an x-y guide table, according to an exemplary embodiment of the present invention. Referring to IS FIG. 5A, a wafer 51 having a photoresist layer 53 disposed thereon is mounted on a precision alignment table 50. The precision alignment table 50 is capable of moving the wafer 51 in an x or y direction by an incremental distance of about 100 nanometers or less and rotating the wafer 51 by an incremental angle of about 0.01 degree. The precision alignment table 50 is guided by a computer to align the wafer 51 with a chip 57. To develop lithography patterns for pockets, a negative photoresist 53 is disposed on the wafer 50. The alignment keys 52 are prefabricated on the wafer 51, along with other package device components and circuits, such as discrete inductors and capacitors, not shown.

Figure 5B:
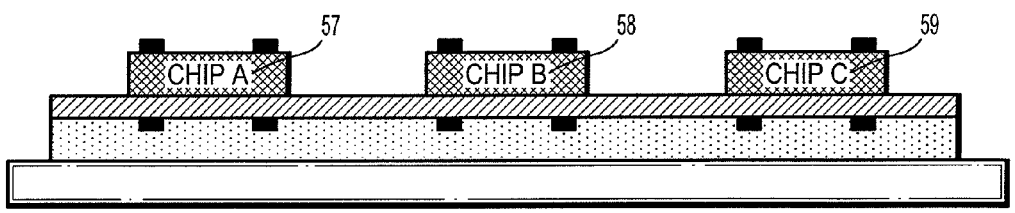
FIG. 5B shows a plurality of chips placed on a wafer mounted on an x-y table, according to another exemplary embodiment of the present invention.

The chip 57, which is held by a clamp device 55, is aligned with the wafer 51 and placed at a predetermined location where a corresponding pocket will be subsequently formed in the wafer 51. Guided by a computer having a preprogrammed memory of the chip's size and location within the computer's memory, the chip 57 is moved to its predetermined location via the clamp device 55. The exact location of the chip 57 is then fine-tuned by an automatic alignment algorithm that guides the movement of the x-y precision alignment table 50. When the desirable alignment is achieved and inspected by a scope 56, the chip 57 is then lowered and placed on the photoresist layer 53. Further, other chips 58 and 59 are aligned in the same manner as the chip 57 described above until all the chips (57, 58 and 59) are placed on the photoresist layer 53 to serve as a mask for a pocket pattern on the wafer carrier 50, as shown in FIG. 5B.

Figure 6:
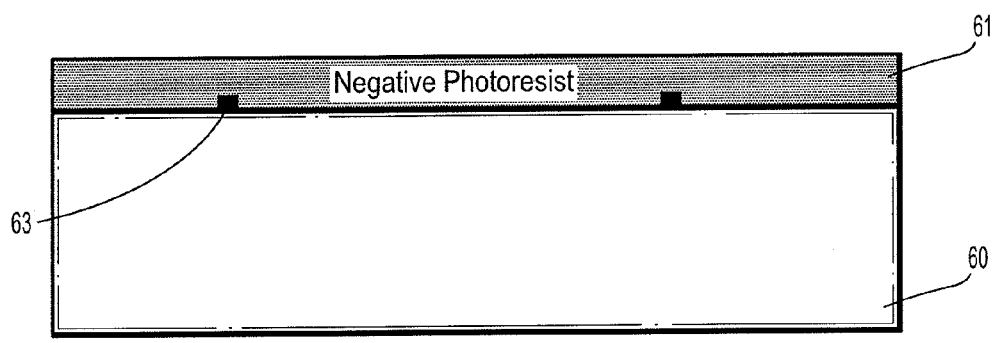
FIGS. 6-14 are cross-sectional views illustrating a method of forming a semiconductor device, according to an exemplary embodiment of the present invention.
Figure 7:
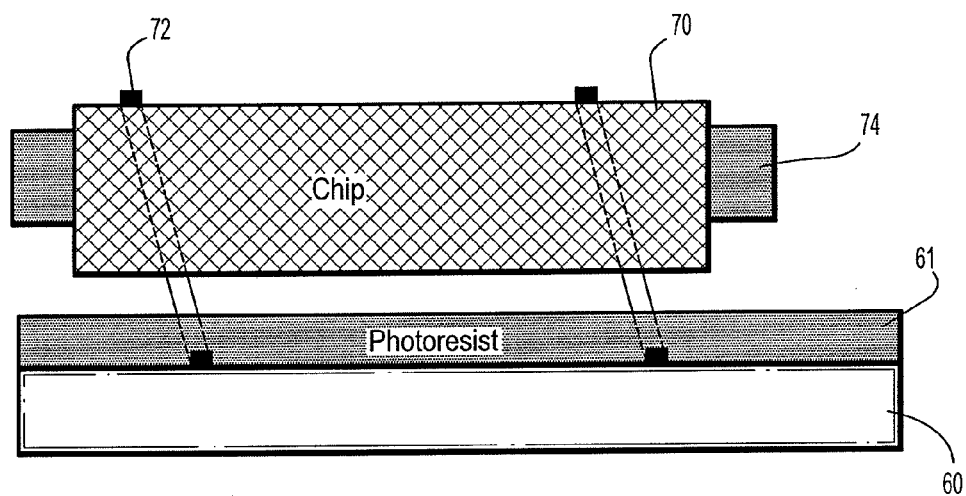
Figure 8:
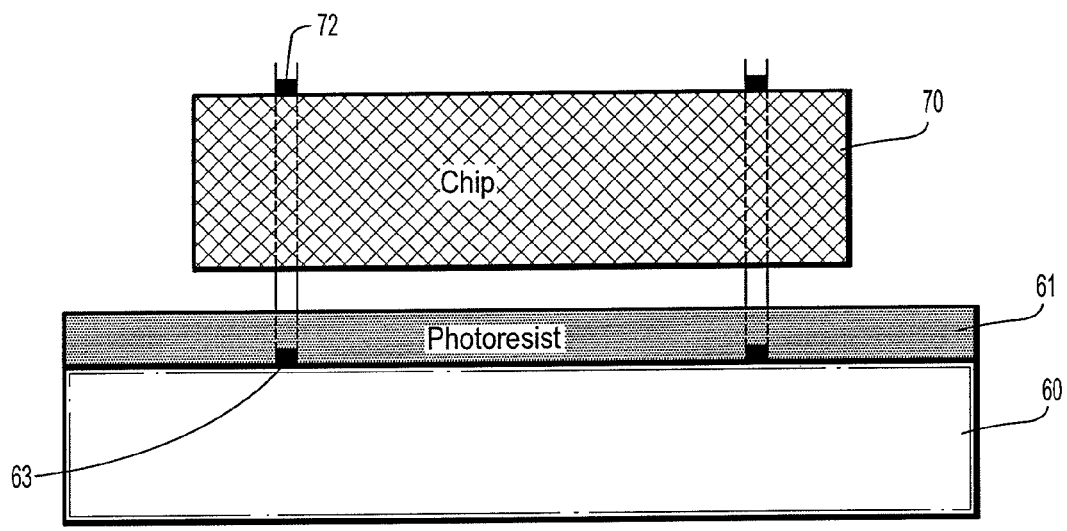
Figure 9:
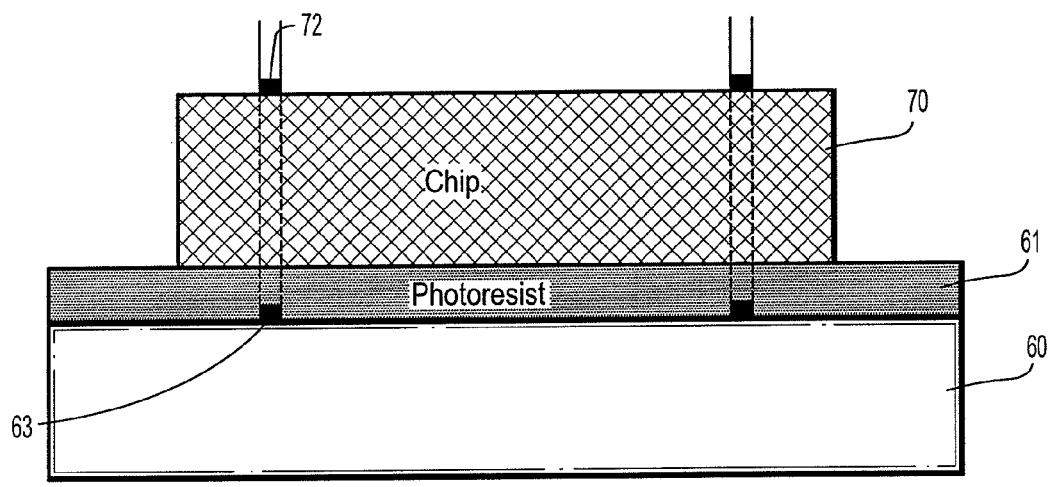

FIGS. 6-14 are cross-sectional views illustrating a method of forming a semiconductor device, according to an exemplary embodiment of the present invention. FIG. 6 shows a cross-section view of a carrier wafer having a photoresist layer disposed thereon. Referring to FIG. 6, a photoresist layer 61 is disposed on a carrier wafer 60 having alignment keys 63. The alignment scheme depicted in FIG. 6 is similar to the alignment scheme illustrated in FIG. 3. In FIG. 7, a clamp device 74 moves a chip 70 above a predetermined portion of the carrier wafer 60 where a corresponding pocket, not shown, will be subsequently formed in the carrier wafer 60. In FIG. 8, alignment keys 72 of the chip 70 are substantially aligned with the alignment keys 63 on the carrier wafer 60. Preferably, a precision alignment table is used to precisely align the alignment keys 72 of the chip 70 with the alignment keys 63 of the carrier wafer 60. Referring to FIG. 9, after the chip 70 and carrier wafer 60 are aligned, the chip 70 is then placed on the photoresist 61 above the predetermined position of the carrier wafer 60 where a corresponding pocket will be subsequently formed therein. In addition, the chip 70 is temporarily held in place by the photoresist 61. The same alignment procedure discussed above may be repeated for other chips until all the chips are aligned with their corresponding pocket region and placed on the photoresist, as similarly shown in FIG. 5B.

Figure 1:
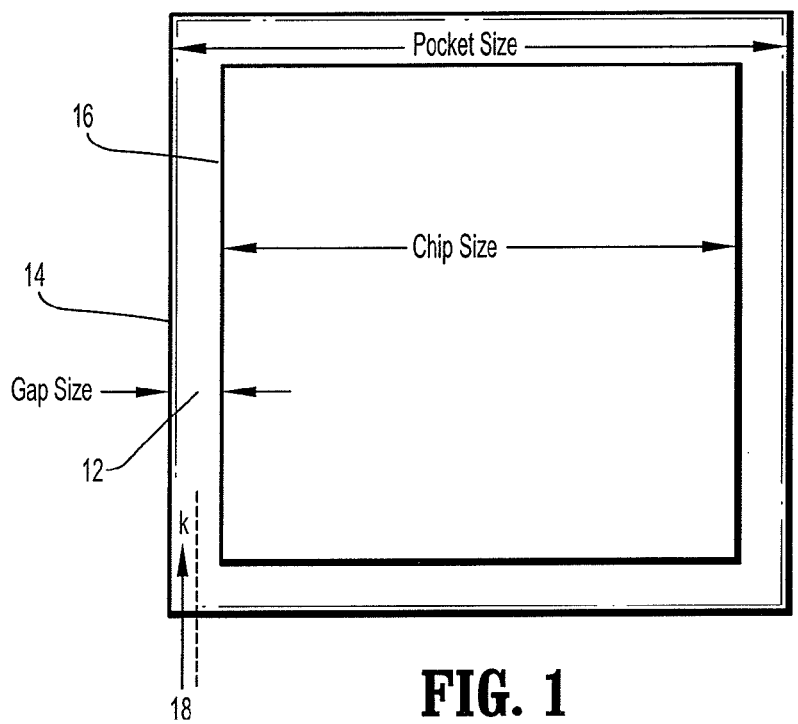
FIG. 1 is a top view of a chip in a pocket of a semiconductor substrate according to the prior art.
Figure 2:
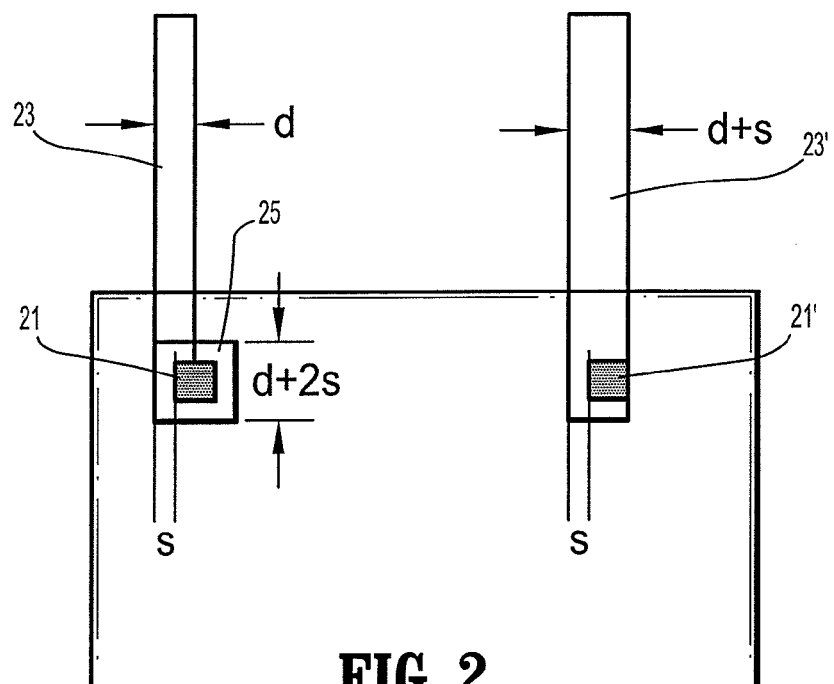
FIG. 2 is a top view of an I/O pad and an interconnect wire on a conventional integrated chip package.
Figure 10:
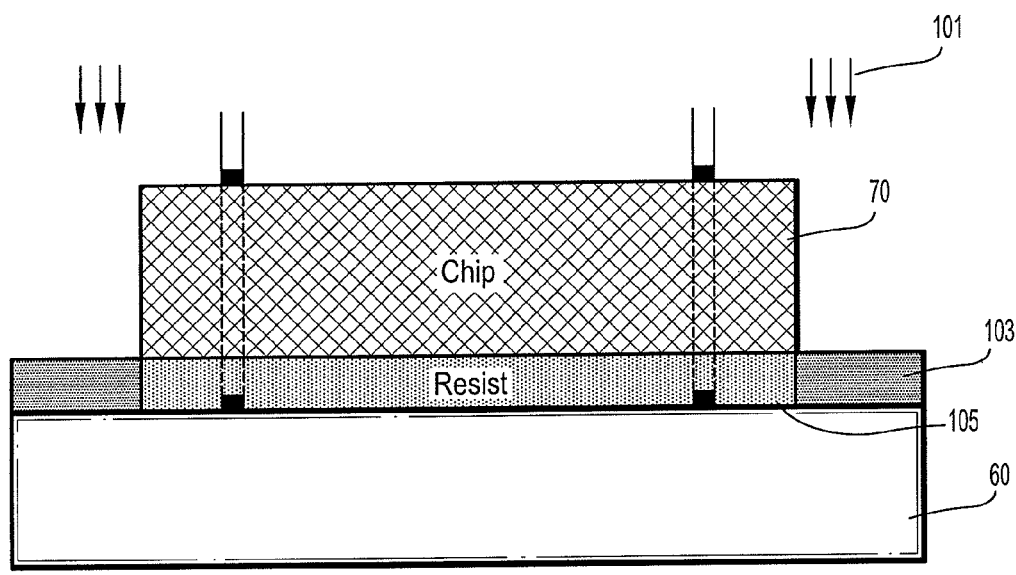
Figure 11:
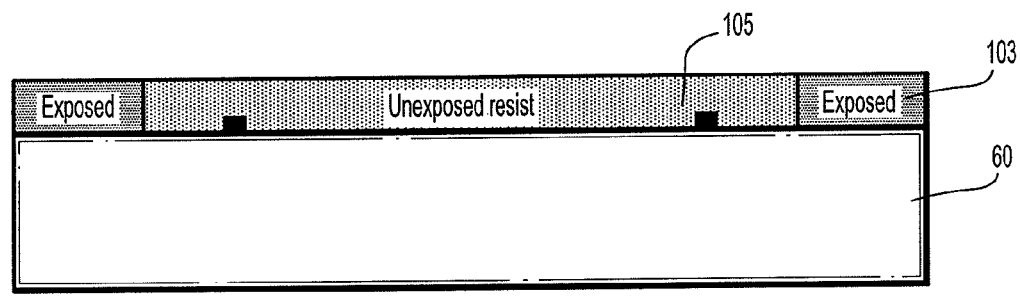
Figure 12:
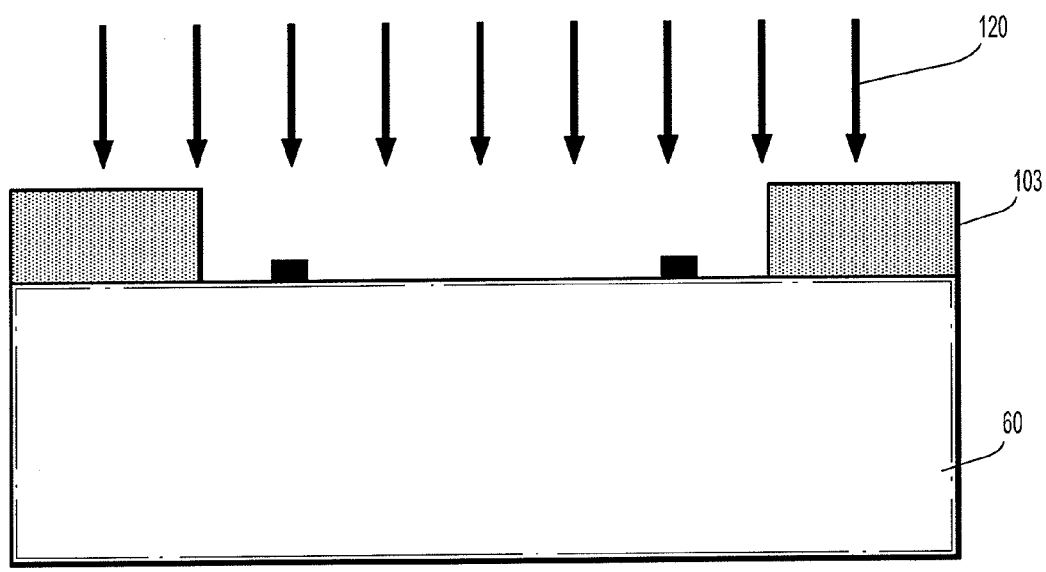
Figure 13:
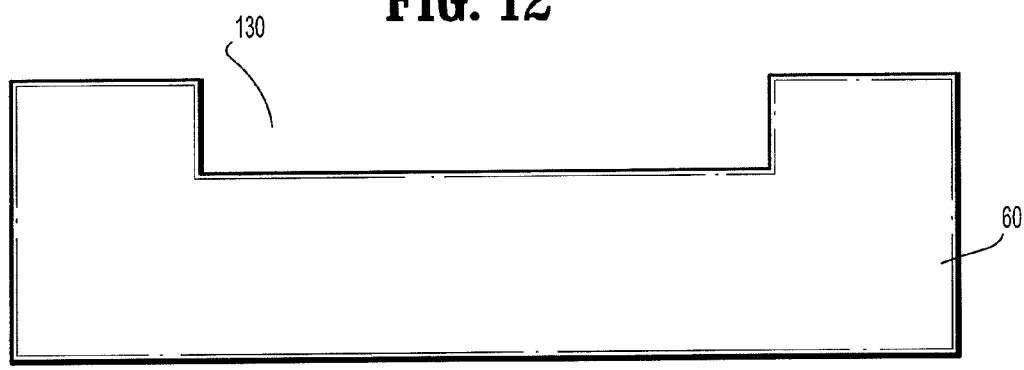
Figure 14:
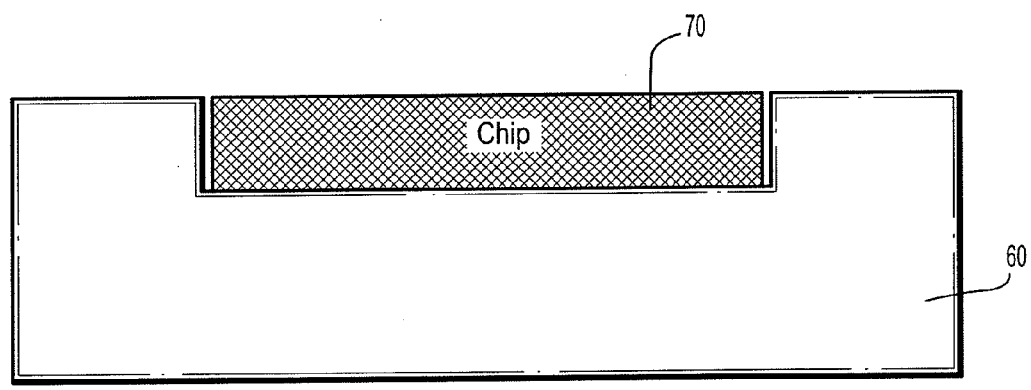

In FIG. 10, a blank exposure 101 is performed on the photoresist 61 to cross-link the polymer in areas, or exposed regions 103, adjacent to the chip 70. The exposed regions 103 become hardened after the exposure 101. In FIG. 1, the chip 70 that served as a mask is removed from the carrier wafer 60. Next, the unexposed photoresist region 105 is developed and removed, while the exposed regions 103 are baked and shrunk by a dimension of "k". In other words, the shrinkage on each side of the exposed regions 103 contributes about 200 nm to the final misalignment tolerance. In FIGS. 12 and 13, the exposed regions 103 serve as a mask for etching 120 the carrier wafer 60 to form a pocket 130 in the carrier wafer 60. Preferably, the etching 120 of the carrier wafer 60 is performed such that the depth of the pocket 130 is substantially equal to the thickness of the chip 70. A directional etching technique such as reactive ion etching (RIE) for deep trench etching can be used to achieve superior resolution of 10 nanometers or less. Next, the photoresist layer 103 is striped and the carrier wafer 60 is cleaned. In FIG. 14, the chip 70 is placed into its corresponding pocket 130, where the maximum misalignment tolerance is estimated to be about 2 k, or about 200 nanometers.

The proposed method discussed above significantly improves the alignment between the chip and the wafer carrier by using the chip itself as the mask to pattern the exact size and shape of its target pocket, which eliminates the misalignment tolerance due to wafer-to-wafer and lot-to-lot process variations. The alignment of a chip and a carrier wafer may be achieved by using a computer-guided x-y precision alignment table.

It is to be noted that a plurality of chips may be temporarily placed on the photoresist using the process described above. Subsequently, the plurality of chips may be used as a mask to expose portions of the photoresist adjacent to the plurality of chips. Since the outline of a pocket follows the exact shape of its corresponding chip, the procedure introduces minimal misalignment despite the rough edges of a chip after partial wafer dicing. In addition, a dark field alignment scheme should be adopted to avoid any scattered photoresist exposure. Resist thickness and baking condition can be further optimized to control the shrinkage dimension.

Figure 15:
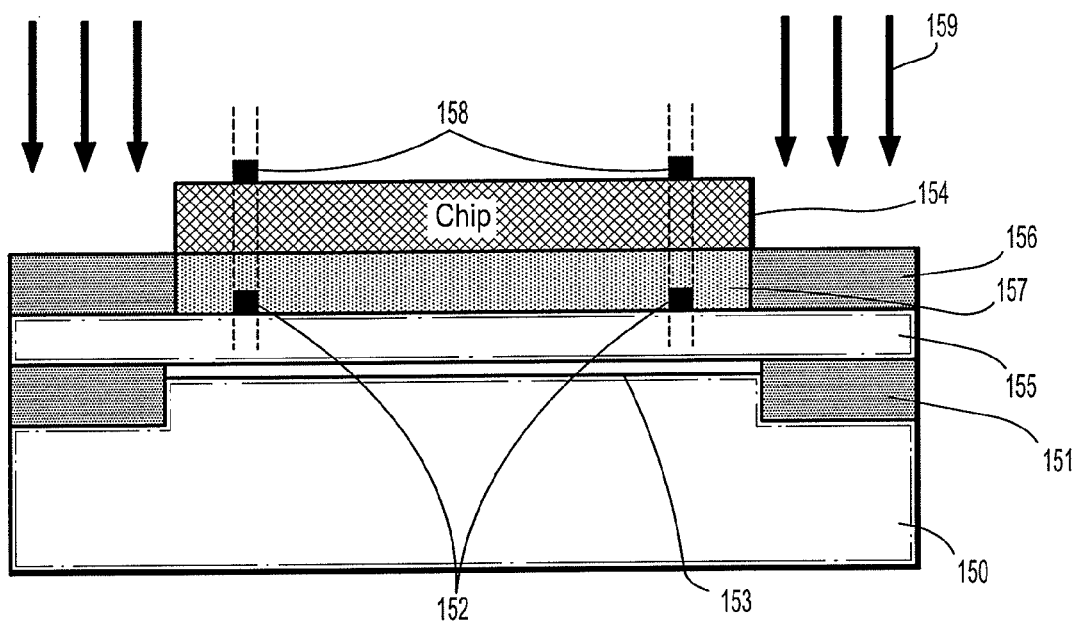
FIGS. 15-20 are cross-sectional views illustrating a method of forming a semiconductor device, according to another exemplary embodiment of the present invention.

FIGS. 15-20 are cross-sectional views illustrating a method of forming a semiconductor device, according to another exemplary embodiment of the present invention. In FIG. 15, a carrier wafer 150 having STI (shallow trench isolation) regions 151 is shown. A wafer 155 having alignment keys 152 is bonded to the STI regions 151 such that a void 153 is formed between the wafer 155 and carrier wafer 150. The wafer 155 is made of a semiconductor material. Preferably, the wafer comprises silicon, silicon germanium (SiGe), or gallium arsenide (GaAs). Next, a photoresist layer, not shown, is disposed on a surface of the wafer 155. Then, a chip 154 having alignment keys 158 is positioned on a surface of the photoresist layer at a predetermined location where a pocket will be subsequently formed in the wafer 155. In other words, the alignment keys 158 of the chip 154 are substantially aligned with the alignment keys 152 of the wafer 155. Next, exposed areas 156 of the photoresist layer are formed adjacent to the chip 154 using an exposure process 159, thereby forming an unexposed region 157 of the photoresist layer under the chip 154. The chip 154 is then removed from the carrier wafer 150.

It should be noted that the procedure discussed above may be repeated for other chips or devices until all the chips or devices are aligned with their corresponding pocket region above a carrier substrate and placed on a photoresist layer. The chips and devices are then used as a mask to expose portions of the photoresist layer adjacent to the chips and devices, thereby allowing the formation of corresponding pockets above the carrier substrate that are substantially the same size and shape of its corresponding chip.

Figure 16:
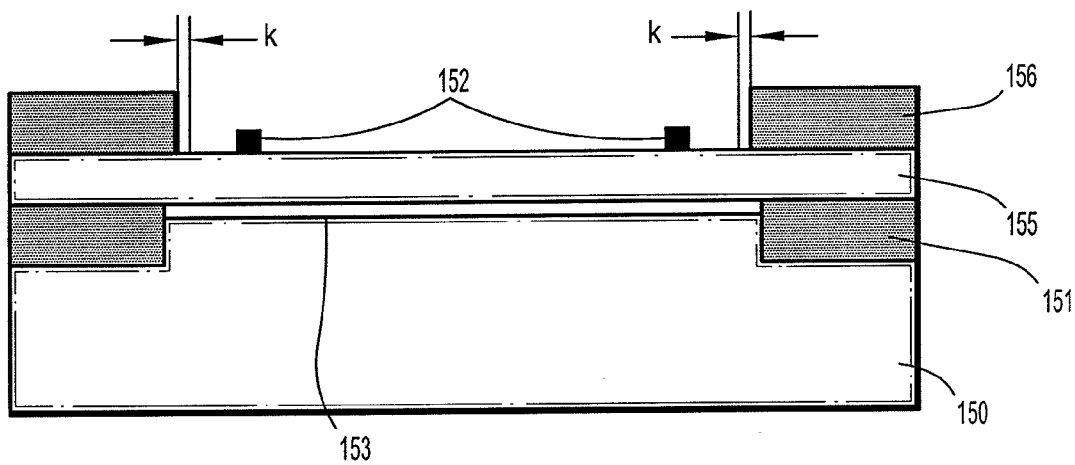
Figure 17:
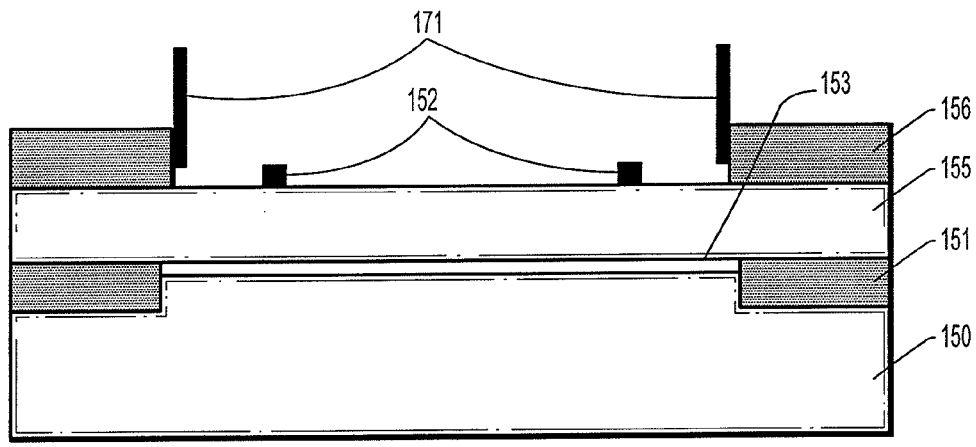
Figure 18:
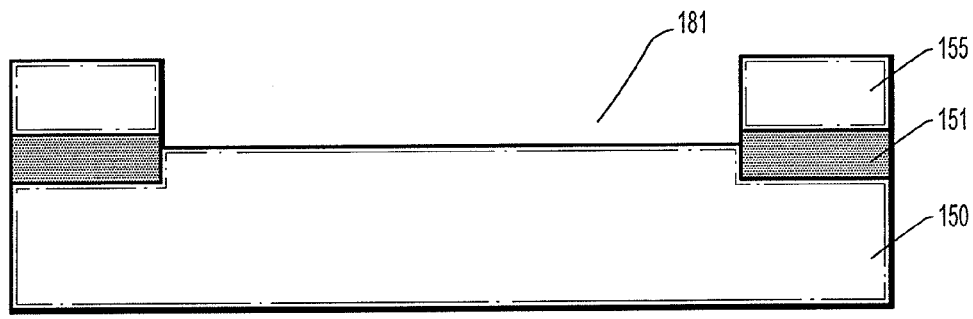
Figure 19:
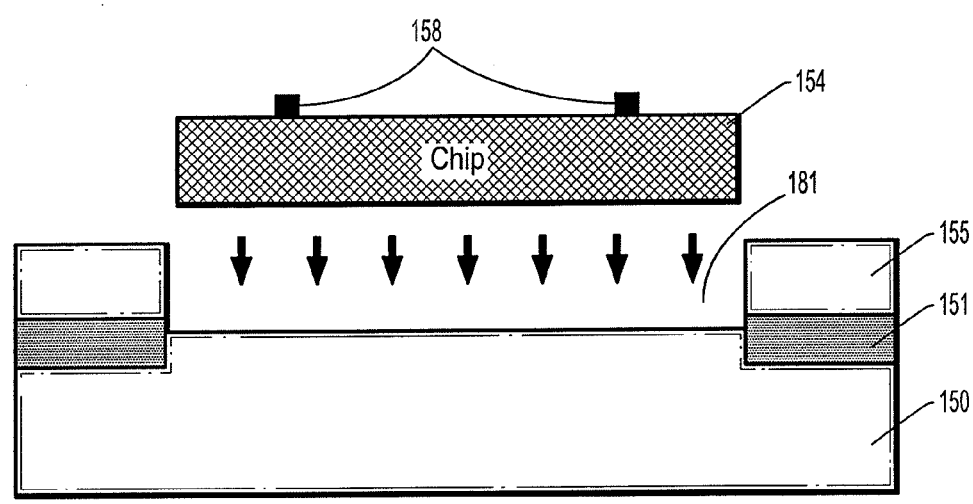
Figure 20:
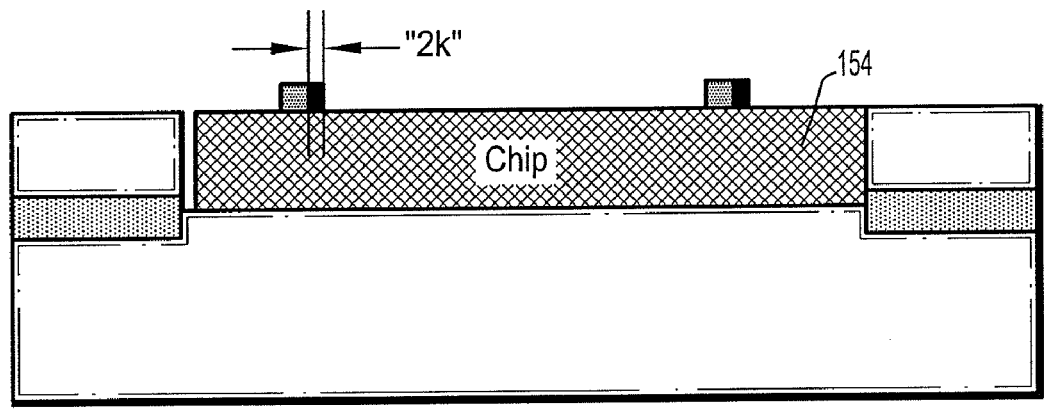

In FIG. 16, the unexposed region 157 is developed and removed, while the exposed regions 156 are baked and shrunk by a dimension of "k". In FIG. 17, a partial wafer dicing technique 171 is performed at predetermined locations between the STI regions 151 to remove a portion of the wafer 155. The partial wafer dicing technique 171 is performed by cutting through the wafer 155 to the void 153 using the baked exposed regions 156 as a mask. Preferably, a passivation layer may be coated on a surface of the wafer 155 prior to performing the partial wafer dicing technique 171. As a result of the partial wafer dicing technique 171, a pocket 181, as depicted in FIG. 18, is formed above the carrier wafer 150. Next, the baked exposed regions 156 are striped and the carrier wafer 150 is cleaned. In FIGS. 19 and 20, the chip 154 is placed within its corresponding pocket such that a surface of the chip 154 is substantially co-planar with the surface of the wafer 155. Preferably, a thermal paste or adhesive may be deposited within the pocket 181 having a thickness substantially equal to the depth of the void 153 prior to placing the chip 154 within its corresponding pocket. Thus, a potential misalignment between the chip 154 and the pocket 181 above the carrier substrate 150 is significantly reduced. The potential misalignment between a chip and its corresponding pocket is preferably about the size of the process tolerance "2 k", the total dimension shrinkage of a baked photoresist on both sides of the pocket. Use of a directional etching technique such as reactive ion etching for partial wafer dicing decreases the potential misalignment to "2 k", while the use of other partial dicing techniques such as laxer dicing may introduce much greater potential misalignment.

It is to be understood that the chip in the exemplary embodiments discussed above may be many different types of chips or devices, e.g., memory chips, logic circuits, MEMs devices, RF circuits, or passive devices.

It is also to be understood that embodiments of the present invention may be implemented in various forms of hardware, software, firmware, special purpose processors, or a combination thereof. In one embodiment, the present invention may be implemented in software as an application program tangibly embodied on a program storage device. The application program may be uploaded to, and executed by, a machine comprising any suitable architecture.

Figure 21:
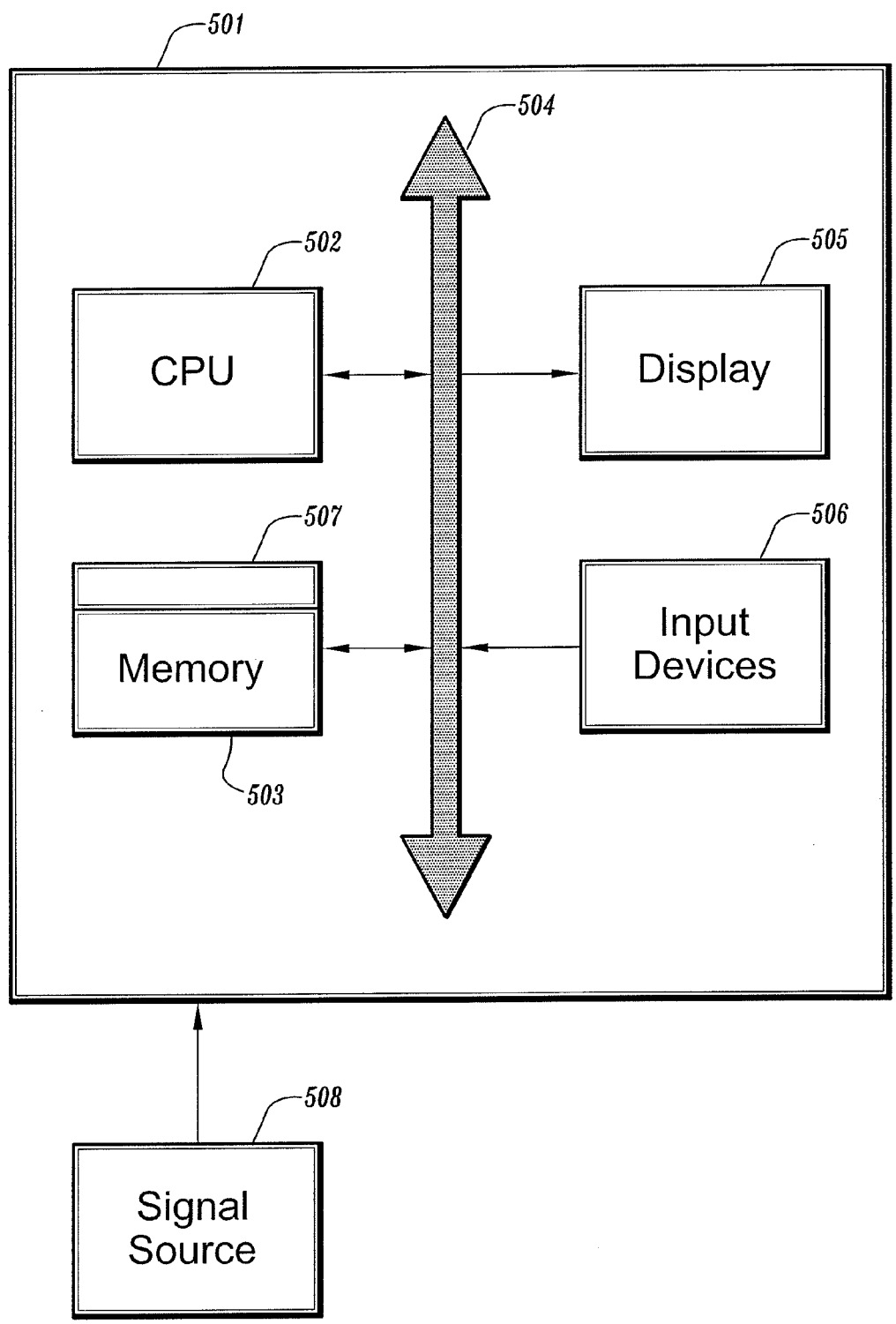
FIG. 21 is a schematic diagram illustrating an exemplary embodiment of a computer system.

FIG. 21 is a schematic diagram illustrating an exemplary embodiment of a computer system. Referring to FIG. 21, according to an exemplary embodiment of the present invention, a computer system 501, or embedded controller, for implementing the present invention includes a central processing unit ("CPU") 502, a memory 503 and an input/output ("I/O") interface 504. The computer system 501 is generally coupled through the I/O interface 504 to a display 505 and various input devices 506 such as a mouse, keyboard, and sensors for sensing, e.g., rotation or movement. The support circuits can include circuits such as cache, power supplies, clock circuits, and a communications bus. The memory 503 can include random access memory ("RAM"), read only memory ("ROM"), disk drive, tape drive, etc., or a combination thereof. The present invention can be implemented as a routine 507 that is stored in memory 503 and executed by the CPU 502 to process a signal from a signal source 508, e.g., a sensor, an actuator, and a robotic device. The CPU 502 then processes the signal source 508, for example, to perform an operation, manipulate a robotic, device, or sending a control signal to an apparatus for performing a method. As such, the computer system 501 is a general-purpose computer system that becomes a specific purpose computer system when executing the routine 507 of the present invention.

The computer system 501 also includes an operating system and microinstruction code. The various processes and functions described herein may either be part of the microinstruction code or part of the application program (or a combination thereof), which is executed via the operating system. In addition, various other peripheral devices may be connected to the computer platform, such as an additional data storage device and a printing device.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A carrier wafer for supporting a chip, comprising:
 a first set of alignment keys formed on a surface of the carrier wafer;
 a negative photoresist formed on the surface of the carrier wafer and over the first set of alignment keys,
 wherein an arrangement of the first set of alignment keys is substantially aligned to an arrangement of a second set of alignment keys disposed on an upper surface of the chip disposed on the negative photoresist, the upper surface of the chip being opposite a lower surface of the chip facing the negative photoresist and wherein a portion of at least one of the first set of alignment keys in the negative photoresist is masked by the chip.

2. The carrier wafer of claim 1, wherein the alignment of the first set of alignment keys and the second set of alignment keys is in a length direction of the alignment keys and the alignment is in a horizontal direction as viewed from above the carrier wafer and the chip, wherein each aligned pair of the first set and second set of alignment keys appears as a single line.

3. The carrier wafer of claim 1, wherein the alignment of the first set of alignment keys and the second set of alignment keys is a in a length direction of the alignment keys and the alignment is in a vertical direction as viewed from above the carrier wafer and the chip, wherein the second set of alignment keys substantially obscure the first set of alignment keys.

4. The carrier wafer of claim 1, wherein the second set of alignment keys are disposed perpendicular to each side of the chip.

5. The carrier wafer of claim 1, wherein the second set of alignment keys comprise pairs of alignment keys disposed at adjacent edges of the chip opposite one another at each corner of the chip.

6. The carrier wafer of claim 1, wherein a portion of each of the first set of alignment keys in the negative photoresist is masked by the chip.

7. The carrier wafer of claim 1, wherein the first and second set of alignment keys are inspectable.

* * * * *